(12) United States Patent
Zhang et al.

(10) Patent No.: US 11,264,594 B2
(45) Date of Patent: Mar. 1, 2022

(54) DISPLAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Huijuan Zhang, Beijing (CN); Pinfan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 174 days.

(21) Appl. No.: 16/661,485

(22) Filed: Oct. 23, 2019

(65) Prior Publication Data
US 2020/0136089 A1    Apr. 30, 2020

(30) Foreign Application Priority Data

Oct. 25, 2018 (CN) .......................... 201811249382.6

(51) Int. Cl.
| | |
|---|---|
| *H01L 51/52* | (2006.01) |
| *H01L 27/32* | (2006.01) |
| *H01L 51/00* | (2006.01) |
| *H01L 51/56* | (2006.01) |

(52) U.S. Cl.
CPC ...... *H01L 51/5253* (2013.01); *H01L 27/3258* (2013.01); *H01L 51/0097* (2013.01); *H01L 51/56* (2013.01)

(58) Field of Classification Search
None
See application file for complete search history.

(56) References Cited

U.S. PATENT DOCUMENTS

| 10,651,429 | B2* | 5/2020 | Sun ..................... H01L 51/5225 |
| 2013/0134627 | A1 | 5/2013 | Hsu et al. |
| 2019/0074470 | A1* | 3/2019 | Takagi ................ H01L 51/0097 |
| 2019/0207130 | A1* | 7/2019 | He ........................ H01L 51/003 |

FOREIGN PATENT DOCUMENTS

| CN | 107482046 A | 12/2017 |
| CN | 107731888 A | 2/2018 |

OTHER PUBLICATIONS

First Office Action dated Mar. 5, 2020, for corresponding Chinese application 201811249382.6.

* cited by examiner

*Primary Examiner* — Michelle Mandala
(74) *Attorney, Agent, or Firm* — Nath, Goldberg & Meyer; Joshua B. Goldberg

(57) ABSTRACT

The present disclosure provides a display substrate and a manufacturing method thereof, and a display device. The display substrate includes a stretchable base substrate; a display functional layer provided on the stretchable base substrate, the display functional layer including a plurality of pixel structures spaced apart from each other, each of the pixel structures including at least one inorganic insulation layer; the pixel structure having an upper surface distal to the stretchable base substrate and a first lateral surface connected between the upper surface and the stretchable base substrate; a protection layer covering at least a portion of the first lateral surface of at least one of the pixel structures corresponding to the inorganic insulation layer.

15 Claims, 6 Drawing Sheets

A-A

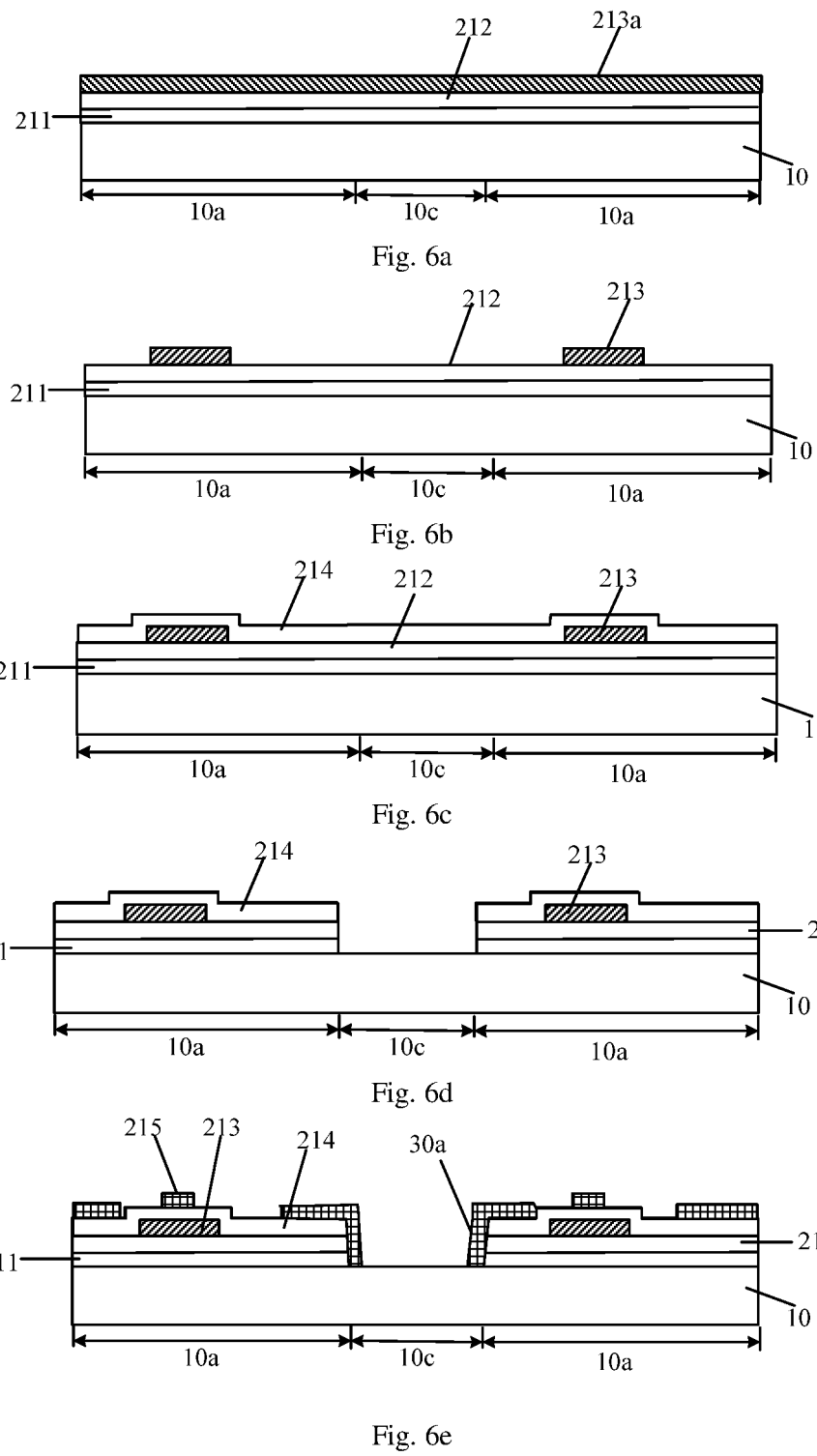

DISPLAY SUBSTRATE AND MANUFACTURING METHOD THEREOF, AND DISPLAY DEVICE

CROSS-REFERENCE TO RELATED APPLICATION

The present disclosure claims the priority to the Chinese Patent Application No. 201811249382.6 filed on Oct. 25, 2018, the disclosure of which is hereby incorporated by reference in its entirety.

TECHNICAL FIELD

The present disclosure relates to a display substrate and a manufacturing method thereof, and a display device.

BACKGROUND

In a stretchable display substrate, a plurality of pixel structures are provided on the base substrate, two adjacent pixel structures in the same row and two adjacent pixel structures in the same column are connected by signal lines, respectively, and each pixel structure is a separate island structure.

SUMMARY

The present disclosure provides a display substrate and a manufacturing method thereof, and a display device.

The display substrate includes: a stretchable base substrate; a display functional layer provided on the stretchable base substrate, the display functional layer including a plurality of pixel structures spaced apart from each other, each of the pixel structures including at least one inorganic insulation layer; the pixel structure having an upper surface distal to the stretchable base substrate and a first lateral surface connected between the upper surface and the stretchable base substrate; and a protection layer covering at least a portion of the first lateral surface of at least one of the pixel structures corresponding to the inorganic insulation layer.

In an embodiment, the display functional layer further includes a connection structure connected between every two adjacent pixel structures, the connection structure includes the at least one inorganic insulation layer, the connection structure has an upper surface distal to the stretchable base substrate and a second lateral surface connected between the upper surface and the stretchable base substrate, and the protection layer further covers at least a portion of the second lateral surface of the connection structure corresponding to the inorganic insulation layer.

In an embodiment, the upper surface of each pixel structure includes a first electrode pattern region and a first edge region located around the first electrode pattern region, the upper surface of each connection structure includes a second electrode pattern region and a second edge region located around the second electrode pattern region, the first edge region is connected to the first lateral surface, and the second edge region is connected to the second lateral surface; the protection layer covers the first edge region and the entire first lateral surface of the pixel structure, and covers the second edge region and the entire second lateral surface of the connection structure.

In an embodiment, the pixel structure further includes a thin film transistor, the thin film transistor includes a gate, an active layer, a source and a drain, at least a portion of the protection layer is provided in a same layer as and is formed by a same material as the source and the drain of the thin film transistor.

In an embodiment, the entire protection layer is provided in the same layer as and is formed by the same material as the source and the drain of the thin film transistor; or a first portion of the entire protection layer is provided in the same layer as and is formed by the same material as the source and the drain of the thin film transistor, while a second portion of the entire protection layer is provided in a same layer as and is formed by a same material as the gate of the thin film transistor.

In an embodiment, a plurality of the pixel structures spaced apart from each other and connection structures connected between every two adjacent pixel structures define a plurality of vias, and each of the vias extends to penetrate the stretchable base substrate.

In an embodiment, a toughness of the protection layer is greater than that of the at least one inorganic insulation layer.

The manufacturing method of a display substrate includes: providing a stretchable base substrate; forming a display functional layer on the stretchable base substrate, the forming the display functional layer including forming a plurality of pixel structures spaced apart from each other, each of the pixel structure including at least one inorganic insulation layer; the pixel structure having an upper surface distal to the stretchable base substrate and a first lateral surface connected between the upper surface and the stretchable base substrate; and forming a protection layer such that the protection layer covers at least a portion of the first lateral surface of at least one of the pixel structures corresponding to the inorganic insulation layer.

In an embodiment, the forming the display functional layer on the stretchable base substrate further includes: forming a connection structure connected between every two adjacent pixel structures such that the connection structure includes the at least one inorganic insulation layer, the connection structure has an upper surface distal to the stretchable base substrate and a second lateral surface connected between the upper surface and the stretchable base substrate; and the forming the protection layer further includes: forming the protection layer such that the protection layer further covers at least a portion of the second lateral surface of the connection structure corresponding to the inorganic insulation layer.

In one embodiment, the forming the display functional layer on the stretchable base substrate further includes forming a first electrode pattern region and a first edge region located around the first electrode pattern region on the upper surface of each pixel structure, and forming a second electrode pattern region and a second edge region located around the second electrode pattern region on the upper surface of each connection structure, the first edge region is connected to the first lateral surface, and the second edge region is connected to the second lateral surface; and forming the protection layer so as to cover the first edge region and the entire first lateral surface of the pixel structure, and cover the second edge region and the entire second lateral surface of the connection structure.

In one embodiment, the forming the pixel structure further includes: forming a thin film transistor, the thin film transistor includes a gate, an active layer, a source and a drain, a first inorganic insulation layer in the at least one inorganic insulation layer is provided between a layer in which the active layer is located and a layer in which the gate is located; and at least a portion of the protection layer is formed by a same patterning process as the source and the drain of the thin film transistor.

In one embodiment, the forming at least a portion of the protection layer by the same patterning process as the source and the drain of the thin film transistor includes: forming a source-drain metal layer on the first inorganic insulation layer, and performing a patterning process on the source-drain metal layer to form the source, the drain, and at least a portion of the protection layer.

In one embodiment, a second inorganic insulation layer in the at least one inorganic insulation layer is formed between the layer in which the gate is located and the stretchable base substrate; and the entire protection layer and the source and the drain of the thin film transistor are formed by a same patterning process; or, a first portion of the protection layer is formed by a same patterning process as the source and the drain of the thin film transistor while a second portion of the protection layer are formed by a same patterning process as the gate of the thin film transistor.

In one embodiment, the forming the first portion of the protection layer by a same patterning process as the source and the drain of the thin film transistor while forming a second portion of the protection layer by a same patterning process as the gate of the thin film transistor includes: forming a first gate metal layer on the second inorganic insulation layer, and performing a patterning process on the first gate metal layer to form the gate and the second portion of the protection layer; and forming a source-drain metal layer on the first inorganic insulation layer, and performing a patterning process on the source-drain metal layer to form the source, the drain, and the first portion of the protection layer.

In one embodiment, a toughness of the protection layer is formed to be greater than that of the at least one inorganic insulation layer.

In one embodiment, the forming the plurality of pixel structures spaced apart from each other and forming the connection structure connected between every two adjacent pixel structures includes defining a plurality of vias on the stretchable base substrate between the plurality of pixel structures and the connection structures connected between every two adjacent pixel structures; after forming the protection layer, the manufacturing method further includes making the plurality of vias further extend to penetrate the stretchable base substrate.

The display device includes the above display substrate and an encapsulation structure which is aligned and assembled with the display substrate to form a cell.

BRIEF DESCRIPTION OF THE FIGURES

The drawings, which constitute a part of the specification, are provided for purposes of further understanding and explaining the present disclosure, and should not be considered as a limitation thereof. In the drawings:

FIGS. 6a to 6j are schematic diagrams showing a manufacturing process of a display substrate.

DETAILED DESCRIPTION

The specific implementations of the present disclosure will be described in detail below in conjunction with the drawings. It will be appreciated that the specific implementations described herein are only for illustrative and explanatory purpose only and are not intended to limit the disclosure.

In a stretchable display substrate, vias for providing tensile strain are usually provided on the base substrate to achieve stretching of the base substrate. The pixel structures and the signal lines are disposed in the region other than the vias. When the current stretchable display substrate is stretched, the stress tends to concentrate at corner positions of edges of a pixel structure, which is likely to cause slight breakage in a film layer. The slight breakage is gradually enlarged into a large crack, resulting in deterioration of the reliability of the stretchable display substrate.

Figure 1:
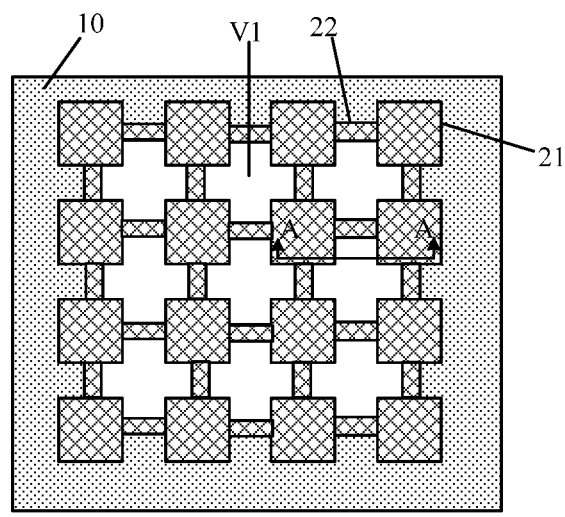
FIG. 1 is a top view of a display substrate according to some embodiments of the present disclosure.
Figure 2:
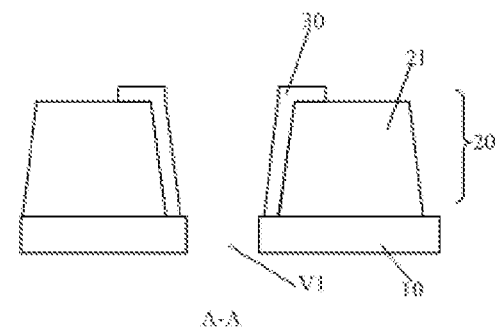
FIG. 2 is a schematic cross-sectional view along line AA of the display substrate in FIG. 1.

FIG. 1 is a top view of a display substrate according to some embodiments of the present disclosure. FIG. 2 is a schematic cross-sectional view along line AA of the display substrate in FIG. 1. As shown in FIGS. 1 to 2, the display substrate may include a stretchable base substrate 10 and a display functional layer 20 provided on the stretchable base substrate 10. The display functional layer 20 includes a plurality of pixel structures 21 spaced apart from each other and a connection structure 22 connected between every two adjacent pixel structures 21. The plurality of pixel structures 21 and corresponding connection structures 22 define a plurality of vias V1 extending to penetrate the display functional layer. The vias V1 extends to penetrate the stretchable base substrate 10. Each of the pixel structure 21 and the connection structure 22 includes at least one inorganic insulation layer. The inorganic insulation layer may include one of silicon nitride layer and silicon oxide layer, or a composite layer of the two. The display functional layer 20 may have an upper surface distal to the stretchable base substrate 10 and a lateral surface connecting the upper surface and the stretchable base substrate 10. For example, as shown in FIG. 2, the upper surface, the lateral surface and a lower surface of the display functional layer 20 form an inverted trapezoidal structure. A protection layer 30 is provided to cover the inorganic insulation layer on the lateral surface of the display functional layer 20. A toughness of the protection layer 30 is greater than that of the inorganic insulation layer.

In some embodiments, the pixel structure 21 is configured to be a structure related to display in a pixel unit. The pixel structure 21 has an upper surface distal to the stretchable base substrate 10, and a lateral surface connected between the upper surface and the stretchable base substrate 10. The protection layer 30 covers the inorganic insulation layer on the lateral surface of the pixel structure 21. The pixel structure 21 may include a thin film transistor, a pixel electrode, a light emitting diode, and the like; the inorganic insulation layer may be a gate insulation layer between a layer in which a gate of the thin film transistor is located and a layer in which an active layer is located, or may be a passivation layer between a layer in which the source and the drain are located and a layer in which the pixel electrode is located, or may be other inorganic insulation film.

The connection structure 22 may include at least one inorganic insulation layer and signal lines provided on the inorganic insulation layer, for example, gate lines, data lines, etc. The connection structure 22 has an upper surface distal to the stretchable base substrate 10, and a lateral surface connected between the upper surface and the stretchable base substrate 10. The protection layer 30 covers at least the inorganic insulation layer on the lateral surface of the connection structure 22. The inorganic insulation layer(s) in the pixel structure 21 may have a one-to-one correspondence with that/those in the connection structure 22, and may be formed integrally with the corresponding inorganic insulation layer(s), respectively.

The plurality of pixel structures 21 may be arranged in a plurality of rows and columns. Two adjacent pixel structures 21 may represent two adjacent pixel structures 21 in a same row or in a same column.

It should be noted that, the lateral surface of the display functional layer 20 includes the lateral surface of the pixel structure 21 and the lateral surface of the connection structure 22. In this case, a position on the lateral surface of the display functional layer 20 corresponding to the inorganic insulation layer may be regarded as a position on the lateral surface of the pixel structure 21 and/or the lateral surface of the connection structure 22 corresponding to the inorganic insulation layer, e.g., a position on a side wall of a via V1 corresponding to the inorganic insulation layer may be regarded as a position on the lateral surface of a corresponding pixel structure 21 and connection structure 22 corresponding to the inorganic insulation layer.

It should also be noted that, the number of inorganic insulation layer may be multiple. In this case, the toughness of the protection layer 30 is greater than that of the inorganic insulation layer. For example, the toughness of the protection layer 30 is greater than the toughness of any of the inorganic insulation layers.

In a display substrate of some embodiments of the present disclosure, a position on the lateral surface of the pixel structure 21 and the lateral surface of the connection structure 22 corresponding to the inorganic insulation layer is covered with a protection layer 30. A part of the strain generated when the display substrate is stretched may be distributed on the protection layer 30, thereby alleviating the strain concentration on the inorganic insulation layer, and reducing or even avoiding the occurrence of a crack on the inorganic insulation layer.

Further, the protection layer 30 has a higher toughness than the inorganic insulation layer, which can reduce or even eliminate the possibility of causing a crack on the protection layer due to the strain concentration, thereby improving the reliability of the display substrate.

Figure 3:
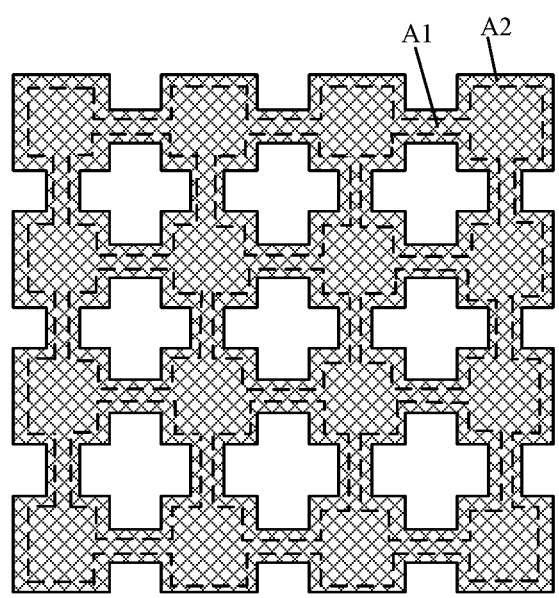
FIG. 3 is a schematic diagram of a region division of an upper surface of a display functional layer.

FIG. 3 is a schematic diagram of a region division of the upper surface of the display functional layer. As shown in FIG. 3, the upper surface of the display functional layer 20 includes an electrode pattern region A1 and an edge region A2 located around the electrode pattern region A1. The edge region A2 is connected to the lateral surface of the display functional layer 20. Projections of structures such as the gate, the active layer, the source and the drain of the thin film transistor, and the pixel electrode on the stretchable base substrate 10 are located in a projection range of the electrode pattern region A1 on the stretchable base substrate 10. As described above, the pixel structures 21 and corresponding connection structures 22 on the display functional layer 20 define a plurality of vias V1 penetrating through the display functional layer 20 and the stretchable base substrate 10; for example, the edge region on the upper surface of the display functional layer 20 may be a portion in the upper surface surrounding each via V1.

In order to protect the inorganic insulation layer fully, in one embodiment, the protection layer 30 covers the entire lateral surface of the display functional layer 20 (e.g., the entire lateral surfaces of the pixel structures 21 and the entire lateral surfaces of the connection structures 22) and the edge region A2 of the display functional layer 20. In one embodiment, the entire lateral surface of the display functional layer 20 is formed as an inclined surface to increase the contact area of the entire lateral surface with the protection layer 30.

Figure 4A:
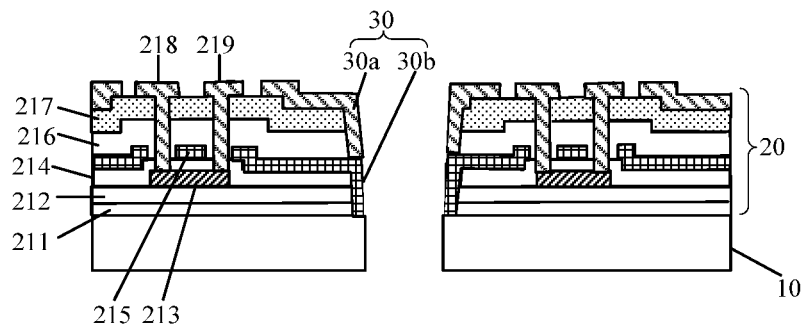
FIG. 4a is a schematic structural diagram of a cross section of the display substrate shown in FIG. 2.
Figure 4B:
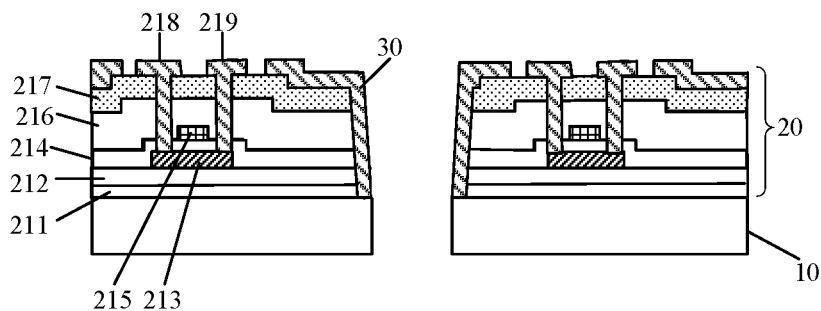
FIG. 4b is another schematic structural diagram of a cross section of the display substrate shown in FIG. 2.

FIG. 4a is a schematic structural diagram of FIG. 2, and FIG. 4b is another schematic structural diagram of FIG. 2. As shown in FIGS. 4a and 4b, the pixel structure 21 includes a thin film transistor and a plurality of inorganic insulation layers. The thin film transistor includes a gate 215, an active layer 213, a source 218 and a drain 219. In one embodiment, the thin film transistor is a low temperature polysilicon thin film transistor, the gate 215 thereof is located on a side of the active layer 213 distal to the stretchable base substrate 10; a material of the gate 215 includes molybdenum, the source 218 and the drain 219 each are lamination of molybdenum/aluminum/molybdenum. The plurality of inorganic insulation layers may include a blocking layer 211, a buffer layer 212, a first gate insulation layer 214, a second gate insulation layer 216 and an interlayer dielectric layer 217.

For example, the blocking layer 211 and the buffer layer 212 are provided between the stretchable base substrate 10 and the active layer 213, the butter layer 212 is provided between the blocking layer 211 and the active layer 213, and the buffer layer 212 has a thickness of 2000 Å to 4000 Å. The first gate insulation layer 214 is located between a layer in which the active layer 213 is located and a layer in which the gate 215 is located; the second gate insulation layer 216 is provided on a side of the layer in which the gate 215 is located distal to the stretchable base substrate 10, a storage electrode (not shown) is provided on the second gate insulation layer 216, and the position of the storage electrode on the second gate insulation layer 216 corresponds to an conductive pattern in the layer in which the gate is located, the storage electrode and the conductive pattern in the layer in which the gate is located form a storage capacitor; the storage electrode may be formed by the same material as the gate. The interlayer dielectric layer 217 is provided on the side of the storage electrode distal to the stretchable base substrate 10, the source 218 and the drain 219 are provided on a side of the interlayer dielectric layer 217 distal to the stretchable base substrate 10. The source 218 and the drain 219 are respectively connected to the active layer 213 through a first via and a second via which correspond to the source 218 and the drain 219 and penetrating the interlayer dielectric layer 217, the first gate insulation layer 214 and the second gate insulation layer 216.

The connection structure 22 also includes a plurality of inorganic insulation layers therein. The plurality of inorganic insulation layers in the connection structure 22 are the same as the inorganic insulation layers in the pixel structure 21 in an one-to-one correspondence. The connection structure 22 also includes a gate line or a data line. The gate line and the gate 215 of the thin film transistor are provided in the same layer and have the same material. The data line and the source 218 and the drain 219 of the thin film transistor are provided in the same layer and have the same material.

It should be noted that, "being provided in the same layer" in the embodiment of the present disclosure refers to that two structures are formed simultaneously using the same material by a single patterning process and thus are located in a same layer; however, it does not mean that the distances between the two structures and the stretchable base substrate 10 must be the same.

In some embodiments of the present disclosure, in order to simplify the manufacturing process, as shown in FIGS. 4a and 4b, at least a portion of the protection layer 30 is provided in the same layer as and has the same material as the source 218 and the drain 219 of the thin film transistor.

For example, as shown in FIG. 4a, the protection layer 30 may include a first portion 30a and a second portion 30b. The first portion 30a of the protection layer 30 may be provided in the same layer as and may have the same material as the gate 215 of the thin film transistor, while the second portion 30b of the protection layer 30 may be provided in the same layer as and may have the same material as the source 218 and the drain 219 of the thin film transistor. That is to say, the first portion 30a of the protection layer 30 is made at the same time when the gate 215 of the thin film transistor is made; the second portion 30b of the protection layer 30 is made at the same time when the source 218 and the drain 219 of the thin film transistor is made, thereby eliminating the process step of manufacturing the protection layer 30 separately.

In one embodiment, as shown in FIG. 4b, the entire protection layer 30 is provided in the same layer as and has the same material as the source 218 and the drain 219 of the thin film transistor. In this way, it is only required to adjust the pattern shape of the layer in which the source 218 and the drain 219 are located when the source 218 and the drain 219 are formed, without changing the manufacturing process of the pattern shape of the layer in which the gate 215 is located, thereby further reducing the process difficulty.

Obviously, the protection layer 30 is not limited to the above film layer provided in the same as and having the same material as the gate 215 or the source 218 and the drain 219; it may employ an organic material film layer having a larger toughness.

In some embodiments of the present disclosure, the stretchable base substrate 10 is made of polyimide (PI). On the stretchable base substrate 10, there are a plurality of vias V1 which are defined by the pixel structures 21 and the corresponding connection structures 22 and which penetrate the display functional layer 20 and extend through the stretchable base substrate 10, so as to improve the stretchability of the stretchable base substrate 10.

Figure 5A:
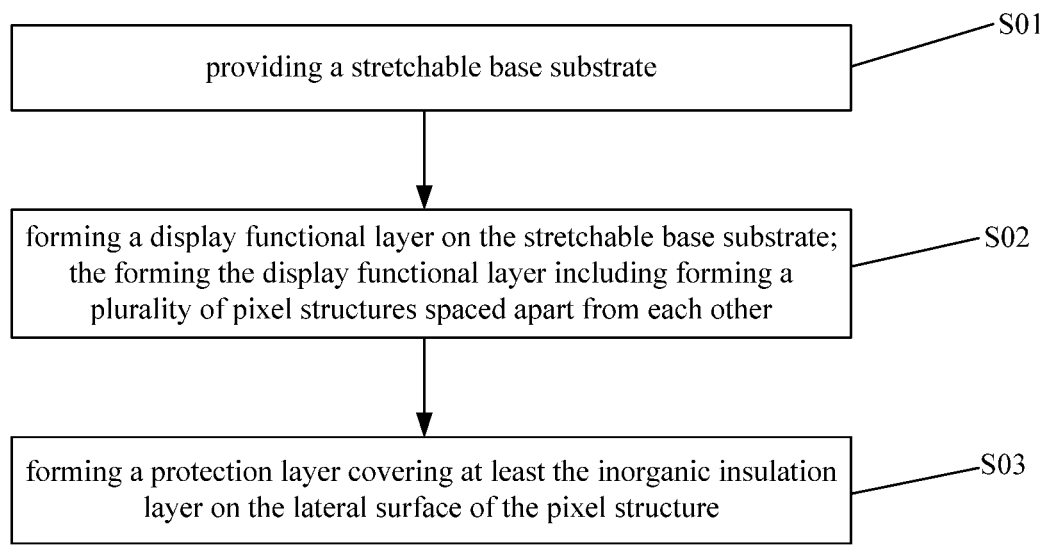
FIG. 5a is a flowchart of a manufacturing method of a display substrate according to some embodiments of the present disclosure.

Some embodiments of the present disclosure provide a manufacturing method of a display substrate. FIG. 5a is a flow chart of a manufacturing method of a display substrate provided by some embodiments of the present disclosure. As shown in FIG. 5a, the manufacturing method of a display substrate includes steps S01 to S03.

S01, providing a stretchable base substrate.

S02, forming a display functional layer on the stretchable base substrate. The forming the display functional layer includes forming a plurality of pixel structures spaced apart from each other and connection structures connected between every two adjacent pixel structures. The pixel structure and the connection structure each include at least one inorganic insulation layer; the display functional layer (such as the pixel structures and the connection structures) has an upper surface distal to the stretchable base substrate and a lateral surface connected between the upper surface and the stretchable base substrate.

S03, forming a protection layer covering at least a portion of the lateral surface of the pixel structure corresponding to the inorganic insulation layer.

In the manufacturing method of a display substrate in some embodiments of the present disclosure, a protection layer covering at least a portion on the lateral surface of the pixel structure corresponding to the inorganic insulation layer is formed, thus a part of the strain generated when the display substrate is stretched may be distributed on the protection layer, thereby alleviating the strain concentration on the inorganic insulation layer, and reducing or even avoiding the occurrence of a crack on the inorganic insulation layer.

In some embodiments, the toughness of the protection layer is greater than that of the inorganic insulation layer.

The upper surface of the pixel structure includes a conductive pattern region and an edge region located around the conductive pattern region. The edge region is connected to the lateral surface of the display functional layer. In order to fully protect the inorganic insulation layer(s), for example, the protection layer covers the entire lateral surface of the display functional layer (such as the entire lateral surfaces of the pixel structures and the connection structures) and the edge region of the display functional layer.

As described above, the pixel structure further includes a thin film transistor. The thin film transistor includes a gate, an active layer, a source and a drain. Inorganic insulation layer(s) is/are formed between a layer in which the active layer is located and a layer in which the gate is located, and between a layer in which the gate is located and the stretchable base substrate. An inorganic insulation layer between the layer in which the active layer is located and the layer in which the gate is located is a first gate insulation layer; the inorganic insulation layers between the layer in which the gate is located and the stretchable base substrate include a buffer layer and a blocking layer.

In order to simplify the process steps, at least a portion of the protection layer is formed by the same patterning process as the source and the drain of the thin film transistor.

For example, the entire protection layer is formed by the same patterning process as the source and the drain of the thin film transistor. For another example, the protection layer includes a first portion and a second portion. The first portion of the protection layer is formed by the same patterning process as the source and the drain of the thin film transistor, while the second portion of the protection layer is formed by the same patterning process as the gate of the thin film transistor.

After forming the display functional layer and the protection layer, the manufacturing method further includes: extending and defining, in the stretchable base substrate, the above vias which penetrate the plurality of pixel structures and corresponding connection structures of the display functional layer, so that the vias further penetrate the display functional layer and the stretchable base substrate.

Figure 5B:
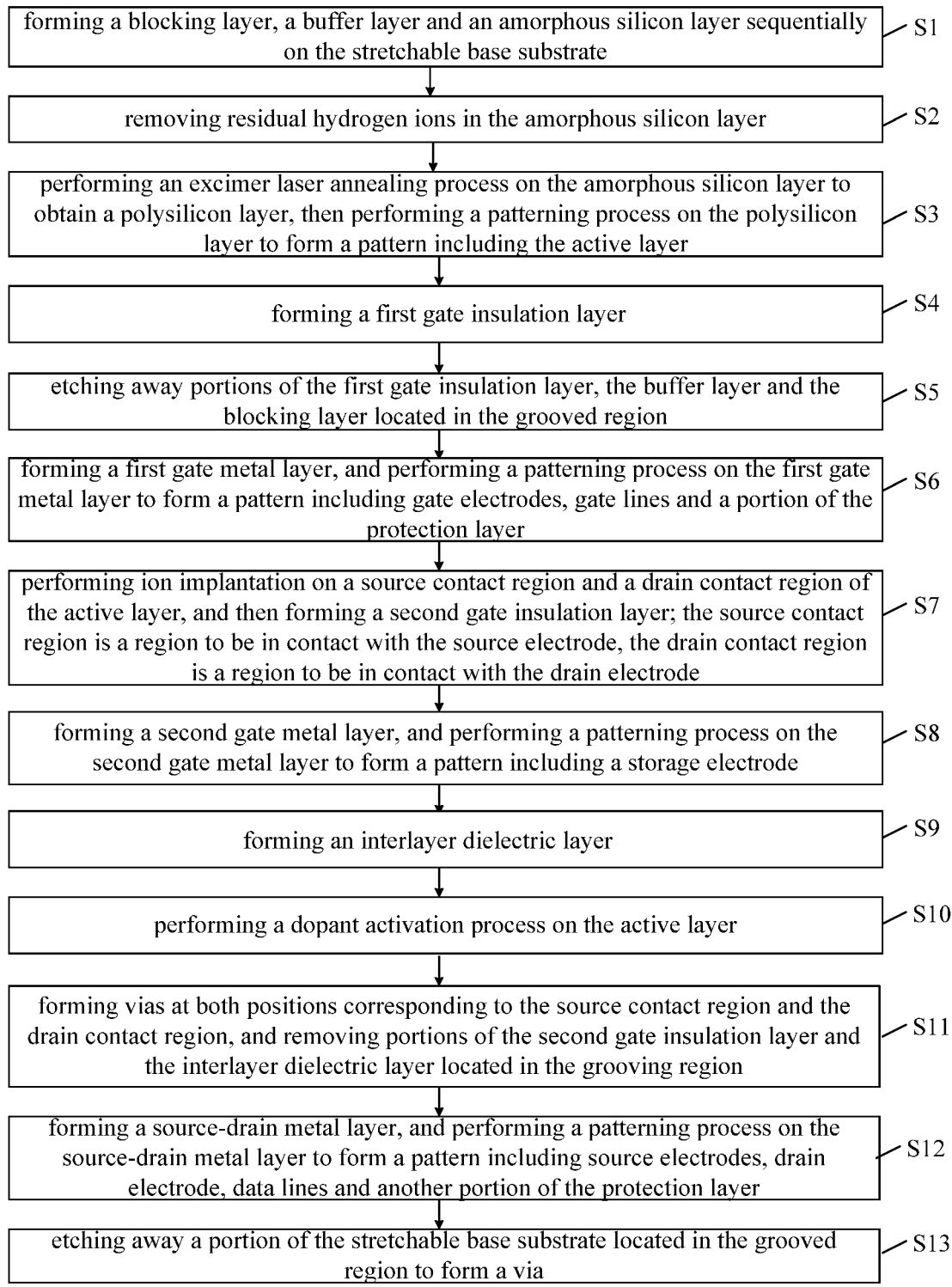
FIG. 5b is a specific flowchart of another manufacturing method of a display substrate according to some embodiments of the present disclosure.

FIG. 5b is a flow chart of another manufacturing method of a display substrate provided by some embodiments of the present disclosure. FIGS. 6a to 6j are schematic diagrams of a manufacturing process of a display substrate. Next, a manufacturing method provided by some embodiments of the present disclosure will be described in detail in conjunction with FIGS. 6a to 6j.

S1, forming a blocking layer 211, a buffer layer 212 and an amorphous silicon layer 213a in sequence on the stretchable base substrate 10. The material of the stretchable base substrate 10 includes polyimide. The stretchable base substrate 10 includes a plurality of pixel structure regions 10a spaced apart from each other and connection regions connected between every two adjacent pixel structure regions 10a. The plurality of pixel structure regions 10a are arranged in a plurality of rows and columns. Regions other than the pixel structure regions 10a and the connection regions are grooved regions 10c.

The blocking layer 211 and the buffer layer 212 each are lamination of silicon nitride/silicon oxide, and the buffer layer 212 has a thickness of 2000 Å to 4000 Å; the amorphous silicon layer 213a has a thickness of 400 Å to 800 Å. In one embodiment, the amorphous silicon layer 213a is formed by the Plasma Enhanced Chemical Vapor Deposition (PECVD) method, the temperature of the process chamber ranges from 35° C. to 400° C., the pressure is 2000 mtor, and the radio frequency power is 100 W. The amorphous silicon layer 213a is deposited by the reaction between SiH4 and H2.

S2, removing residual hydrogen ions in the amorphous silicon layer 213a to prevent the residual hydrogen ions from affecting subsequent crystallization. For example, the residual hydrogen ion may be removed by the conventional annealing furnace insulation.

S3, performing an excimer laser annealing (ELA) process on the amorphous silicon layer 213a to obtain a polysilicon layer; thereafter, performing a patterning process on the polysilicon layer to form a pattern including the active layer 213, as shown in FIG. 6b. Each pixel structure 10a is formed with an active layer 213 therein.

S4, forming a first gate insulation layer 214, as shown in FIG. 6c. The first gate insulation layer 214 may be a composite layer of silicon oxide layer and silicon nitride layer. S5, etching away portions of the first gate insulation layer 214, the buffer layer 212 and the blocking layer 211 located in the grooved region 10c, as shown in FIG. 6d. An etching width in the grooved region 10c may be determined according to the amount of stretching to be achieved. In some embodiments, the etch width is from 20 µm to 160 µm.

S6, forming a first gate metal layer, and performing a patterning process on the first gate metal layer to form a pattern including gates 215, gate lines and first portions 30a of the protection layer, as shown in FIG. 6e. Each pixel structure region 10a is formed with a gate 215 therein, the gate 215 is arranged opposite to the active layer 213. In one embodiment, a material of the first gate metal layer includes molybdenum.

Figure 6F:
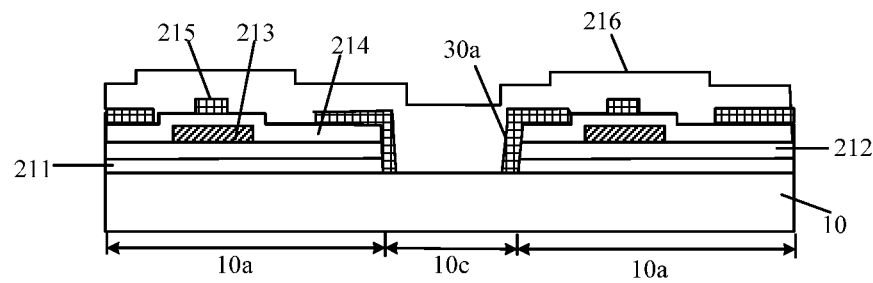

S7, performing ion implantation on a source contact region and a drain contact region of the active layer 213, and forming a second gate insulation layer 216, as shown in FIG. 6f; the source contact region is a region to be in contact with the source, and the drain contact region is a region to be in contact with the drain.

S8, forming a second gate metal layer, and performing a patterning process on the second gate metal layer to form a pattern including a storage electrode. The storage electrode and a part of a conductive structure in a layer in which the gate is located are arranged opposite to each other to form the storage capacitor.

Figure 6G:
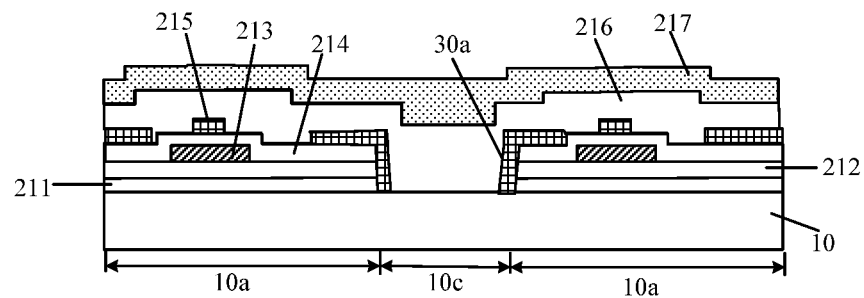

S9, forming an interlayer dielectric layer 217, as shown in FIG. 6g. The interlayer dielectric layer 217 may be a lamination of silicon oxide layer/silicon nitride layer.

S10, performing a dopant activation process on the active layer 213.

Figure 6H:
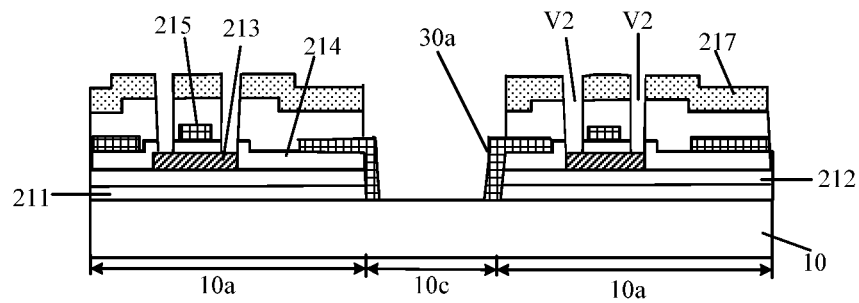

S11, forming a first via V2 and a second via V3 at both positions corresponding to the source contact region and the drain contact region, and removing portions of the second gate insulation layer 216 and the interlayer dielectric layer 217 located in the grooving region 10c, as shown in FIG. 6h. The first via V2 and the second via V3 each penetrate the second gate insulation layer 216, the interlayer dielectric layer 217 and the first gate insulation layer 214.

Figure 6I:
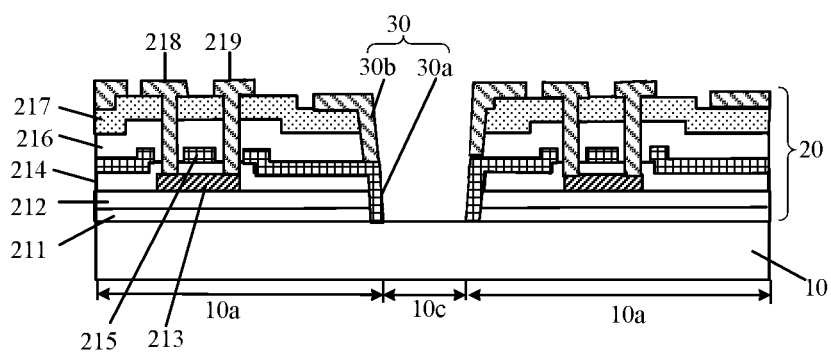

S12, forming a source-drain metal layer, and performing a patterning process on the source-drain metal layer to form a pattern including a source 218, a drain 219, data lines and second portions 30b of the protection layer, as shown in FIG. 6i.

Each pixel structure region 10a is formed with a source 218 and a drain 219 therein, the source 218 is connected to the source contact region of the active layer 213 through the first via, and the drain 219 is connected to the drain contact region of the active layer 213 through the second via. Film layers other than the protection layer 30 in each pixel structure region 10a constitute the above pixel structure 21, and film layers other than the protection layer 30 in each connection region 10a constitute the above connection structure 22. A plurality of pixel structures 21 and a plurality of connection structures 11 connected with each other constitute the above display functional layer 20. The upper surface of the display functional layer 20 includes an electrode pattern region and an edge region located around the electrode pattern region. The protection layer 30 covers the edge region and portions of the lateral surface of the display functional layer 20 corresponding to the blocking layer 211, the buffer layer 212, the first gate insulation layer 214, the second gate insulation layer 216 and the interlayer dielectric layer 217, and a projection of the protection layer 30 on the stretchable base substrate 10 exposes the grooved region.

It will be appreciated that, in order to cause the protection layer 30 to cover the lateral surface of the display functional layer 20, and to cause the projection of the protection layer 30 on the stretchable base substrate 10 to expose the grooved region, an etching width should be smaller than the etching width in step S5 and greater than 0 when etching a portion of the source-drain metal layer located in the grooved region 10c. In one embodiment, the etching width of the portion of the source-drain metal layer located in the grooved region 10c is from 15 µm to 155 µm.

Figure 6J:
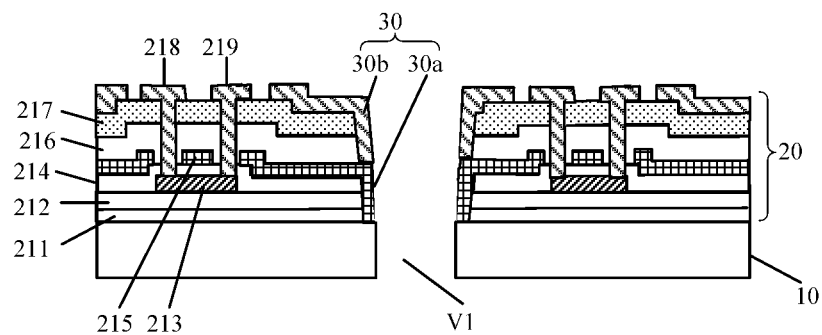

S13, etching away a portion of the stretchable base substrate 10 located in the grooved region 10c to form a via V1 penetrating the display functional layer and the stretchable base substrate, as shown in FIG. 6j. A portion of the via V1 corresponding to the stretchable base substrate 10 may be formed by laser etching. Since the protection layer 30 covers the lateral surface of the display functional layer 20 and exposes the grooved region 10c, the protection layer 30 may serve as an etching stop layer to etch away the portion of the stretchable base substrate 10 located in the grooved region 10c when the stretchable base substrate 10 is etched.

In the manufacturing method of FIG. 5b, the first portion 30a of the protection layer 30 is provided in the same layer as the gate, and the second portion 30b of the protection layer 30 is manufactured along with the source 218 and the drain 219. As described above, the entire protection layer 30 may be manufactured along with the source 218 and the drain 219; a manufacturing method for this case is similar to the manufacturing method of FIG. 5b, and the difference therebetween is that: the first gate insulation layer 214, the buffer layer 212, and the blocking layer 211 may not be etched before the pattern including the gate is formed, but may be etched in the step of forming the first via V2 and the second via V3; furthermore, the portion of the first gate metal layer located in the grooved region 10c is etched away when forming the gate 215; then the source-drain metal layer is formed and is processed by a patterning process. The entire protection layer 30 is formed in synchronization with the source 218 and the drain 219.

The manufacturing method of a display substrate of an embodiment of the present disclosure may be a method for manufacturing the display substrate in any of the above embodiments in FIGS. 1 to 4b. In other embodiments of the present disclosure, the display substrate in any of the above embodiments in FIGS. 1 to 4b may be formed by other processes. For specific features and technical effects of respective structures, reference may be made to the foregoing embodiments, and details are not described herein again.

Figure 7:
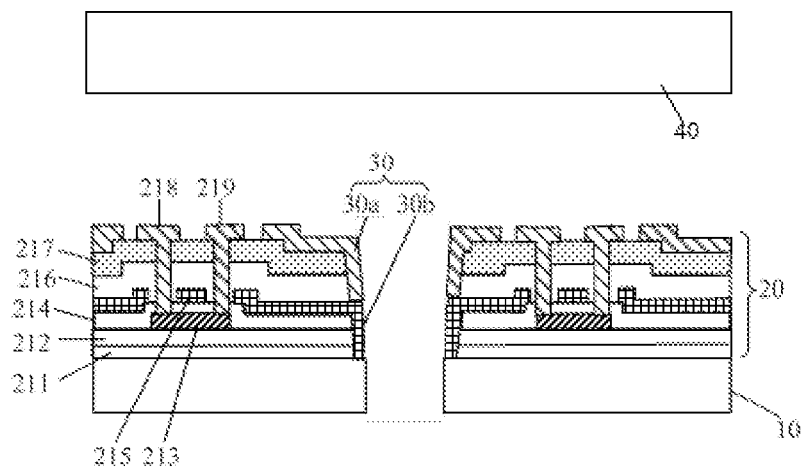
FIG. 7 is a schematic diagram of a display device according to some embodiments of the present disclosure.

Some embodiments of the present disclosure provide a display device which, as shown in FIG. 7, may include the above display substrate and an encapsulation structure 40 aligned with the display substrate to form a cell. The display device may be an organic electroluminescent display device. In this case, the pixel structure is further provided thereon with a light emitting unit and the like.

The display device may be any product or component having a display function, such as a mobile, a tablet, a television, a display, a notebook computer, a digital photo frame, a navigator, etc., The above is the description of the display substrate and the manufacturing method thereof and the display device provided by the present disclosure. It can be seen that, under the protection of the protection layer, a part of the strain generated when the display substrate is stretched may be distributed on the protection layer, thereby alleviating the degree of the strain concentration on the inorganic insulation layer, and reducing or even avoiding the occurrence of a crack on the inorganic insulation layer; on the other hand, compared with the inorganic insulation layer, the protection layer has a higher toughness, thus further reducing or even eliminating the possibility of causing a crack on the protection layer due to the strain concentration, thereby improving the reliability of the display substrate. In addition, a portion of the protection layer is formed in synchronization with the gate of the thin film transistor while another portion of the protection layer is formed in synchronization with the source and the drain of the thin film transistor, or the entire protection layer is formed in synchronization with the source and the drain of the thin film transistor, thereby simplifying the process steps.

It will be appreciated that the above implementations are only exemplary implementations for explaining the principle of the present disclosure. However, the present disclosure is not limited thereto. Various modifications and improvements may be made by an ordinary person skilled in the art without departing from the spirit and essence of the disclosure, and should be covered within the protective scope of the present disclosure.

What is claimed is:

1. A display substrate, comprising:
a stretchable base substrate;
a display functional layer on the stretchable base substrate, the display functional layer comprising a plurality of pixel structures spaced apart from each other, each of the pixel structures comprising at least one inorganic insulation layer; the pixel structure having an upper surface distal to the stretchable base substrate and a first lateral surface connected between the upper surface and the stretchable base substrate; and
a protection layer covering at least a portion of the first lateral surface of at least one pixel structure of the plurality of pixel structures corresponding to the inorganic insulation layer;
the display functional layer further comprises a connection structure connected between every two adjacent pixel structures of the plurality of pixel structures, and
the plurality of pixel structures spaced apart from each other and the connection structure connected between every two adjacent pixel structures define a plurality of vias, and each of the vias extends to penetrate the stretchable base substrate.

2. The display substrate of claim 1, wherein the connection structure comprises the at least one inorganic insulation layer,
the connection structure has an upper surface distal to the stretchable base substrate and a second lateral surface connected between the upper surface and the stretchable base substrate, and the protection layer further covers at least a portion of the second lateral surface of the connection structure corresponding to the inorganic insulation layer.

3. The display substrate of claim 2, wherein the upper surface of each of the at least one pixel structure comprises a first electrode pattern region and a first edge region located around the first electrode pattern region, the upper surface of the connection structure comprises a second electrode pattern region and a second edge region located around the second electrode pattern region, the first edge region is connected to the first lateral surface, and the second edge region is connected to the second lateral surface; and
the protection layer covers the first edge region and the entire first lateral surface of the pixel structure, and covers the second edge region and the entire second lateral surface of the connection structure.

4. The display substrate of claim 1, wherein each of the at least one pixel structure further comprises a thin film transistor, the thin film transistor comprises a gate, an active layer, a source and a drain, and at least a portion of the protection layer is provided in a same layer as the source and the drain of the thin film transistor and is formed by a same material as the source and the drain of the thin film transistor.

5. The display substrate of claim 4, wherein all of the protection layer is provided in a same layer as the source and the drain of the thin film transistor and is formed by a same material as the source and the drain of the thin film transistor; or
a first portion of all of the protection layer is provided in a same layer as the source and the drain of the thin film transistor and is formed by a same material as the source and the drain of the thin film transistor, while a second portion of all of the protection layer is provided in a same layer as the gate of the thin film transistor and is formed by a same material as the gate of the thin film transistor.

6. The display substrate of claim 1, wherein a toughness of the protection layer is greater than that of the at least one inorganic insulation layer.

7. A display device comprising the display substrate of claim 1 and an encapsulation structure which is aligned and assembled with the display substrate to form a cell.

8. A manufacturing method of a display substrate, comprising:
providing a stretchable base substrate;
forming a display functional layer on the stretchable base substrate, which comprises forming a plurality of pixel structures spaced apart from each other, each of the pixel structure comprising at least one inorganic insulation layer; the pixel structure having an upper surface distal to the stretchable base substrate and a first lateral surface connected between the upper surface and the stretchable base substrate; and forming a protection layer such that the protection layer covers at least a portion of the first lateral surface of at least one pixel structure of the plurality of pixel structures corresponding to the inorganic insulation layer, the forming the display functional layer on the stretchable base substrate further comprises: forming a connection structure connected between every two adjacent pixel structures of the plurality of pixel structures;

the forming the plurality of pixel structures spaced apart from each other and forming the connection structure connected between every two adjacent pixel structures comprises defining a plurality of vias on the stretchable base substrate between the plurality of pixel structures and the connection structures connected between every two adjacent pixel structures; and after forming the protection layer, the manufacturing method further comprises making the plurality of vias further extend to penetrate the stretchable base substrate.

9. The manufacturing method of claim 8, wherein the connection structure comprises the at least one inorganic insulation layer, the connection structure has an upper surface distal to the stretchable base substrate and a second lateral surface connected between the upper surface and the stretchable base substrate; and the forming the protection layer further comprises: forming the protection layer such that the protection layer further covers at least a portion of the second lateral surface of the connection structure corresponding to the inorganic insulation layer.

10. The manufacturing method of claim 9, wherein the forming the display functional layer on the stretchable base substrate further comprises forming a first electrode pattern region and a first edge region located around the first electrode pattern region on the upper surface of each of the at least one pixel structure, and forming a second electrode pattern region and a second edge region located around the second electrode pattern region on the upper surface of the connection structure, the first edge region is connected to the first lateral surface, and the second edge region is connected to the second lateral surface; and forming the protection layer so as to cover the first edge region and the entire first lateral surface of the pixel structure, and cover the second edge region and the entire second lateral surface of the connection structure.

11. The manufacturing method of claim 8, wherein the forming the pixel structure further comprises: forming a thin film transistor, the thin film transistor comprises a gate, an active layer, a source and a drain, a first inorganic insulation layer in the at least one inorganic insulation layer is provided between a layer in which the active layer is located and a layer in which the gate is located; and at least a portion of the protection layer is formed by a same patterning process as the source and the drain of the thin film transistor.

12. The manufacturing method of claim 11, wherein the forming at least a portion of the protection layer by the same patterning process as the source and the drain of the thin film transistor comprises:

forming a source-drain metal layer on the first inorganic insulation layer, and performing a patterning process on the source-drain metal layer to form the source, the drain, and at least a portion of the protection layer.

13. The manufacturing method of claim 11, wherein a second inorganic insulation layer in the at least one inorganic insulation layer is formed between the layer in which the gate is located and the stretchable base substrate; and the entire protection layer and the source and the drain of the thin film transistor are formed by a same patterning process; or, a first portion of the protection layer is formed by a same patterning process as the source and the drain of the thin film transistor while a second portion of the protection layer are formed by a same patterning process as the gate of the thin film transistor.

14. The manufacturing method of claim 13, wherein the forming the first portion of the protection layer by a same patterning process as the source and the drain of the thin film transistor while forming a second portion of the protection layer by a same patterning process as the gate of the thin film transistor comprises:

forming a first gate metal layer on the second inorganic insulation layer, and performing a patterning process on the first gate metal layer to form the gate and the second portion of the protection layer; and forming a source-drain metal layer on the first inorganic insulation layer, and performing a patterning process on the source-drain metal layer to form the source, the drain, and the first portion of the protection layer.

15. The manufacturing method of claim 8, wherein a toughness of the protection layer is formed to be greater than that of the at least one inorganic insulation layer.

\* \* \* \* \*